United States Patent
Menkhoff

(10) Patent No.: US 7,529,314 B2
(45) Date of Patent: May 5, 2009

(54) CARRIER PHASE DETECTOR

(75) Inventor: Andreas Menkhoff, Oberhaching (DE)

(73) Assignee: Infineon Technologies AG, Munich (DE)

( * ) Notice: Subject to any disclaimer, the term of this patent is extended or adjusted under 35 U.S.C. 154(b) by 695 days.

(21) Appl. No.: 11/173,205

(22) Filed: Jul. 1, 2005

(65) Prior Publication Data

US 2006/0023826 A1 Feb. 2, 2006

(30) Foreign Application Priority Data

Jul. 28, 2004 (DE) .................. 10 2004 036 464

(51) Int. Cl.
*H04L 27/10* (2006.01)
*H04L 27/18* (2006.01)

(52) U.S. Cl. .................. 375/279; 375/329; 375/327; 375/326; 375/375; 375/376; 329/306; 329/346; 329/304

(58) Field of Classification Search .......... 375/279, 375/280, 281, 329, 332; 329/306, 346, 304; 327/327, 326, 375, 376
See application file for complete search history.

(56) References Cited

U.S. PATENT DOCUMENTS 5,521,548 A * 5/1996 Sugawara .................. 329/306
6,690,745 B1 * 2/2004 Horii et al. ................. 375/316
6,781,447 B2 * 8/2004 Linsky et al. .............. 329/304
6,956,924 B2 * 10/2005 Linsky et al. .............. 375/376

FOREIGN PATENT DOCUMENTS

DE EP 0 579 100 1/1994
KR EP 0 769 364 4/1997

OTHER PUBLICATIONS

German Office Action dated Dec. 21, 2004.

* cited by examiner

*Primary Examiner*—Phuong Phu
(74) *Attorney, Agent, or Firm*—Jenkins, Wilson, Taylor & Hunt, P.A.

(57) ABSTRACT

Carrier phase detector for calculation of a feedback signal (D) for a carrier phase loop in a receiver, which loop detects a phase error ($\Delta\phi$) between a phase ($\phi_{in}$) of a received signal ($E_{in}$), which comprises a sequence of received data symbols, and a nominal phase ($\phi_{nom}$) of a nominal data symbol ($E_{nom}$), with the carrier phase detector in each case calculating the feedback signal (D) as a function of the real part and of the imaginary part of a received data symbol ($E_{in}$), with a received data symbol ($E_{in}$) whose phase is in a boundary phase area being weighted gradually to a lesser extent during the calculation of the feedback signal (D), with the boundary phase area in each case being arranged symmetrically with respect to a mid-phase ($\phi_{mid}$) which is located in the centre between the two nominal phases ($\phi_{nom}$) of equidistant nominal data symbols ($E_{nom}$), and having a phase extent which is determined by a boundary phase ($\phi_g$).

13 Claims, 11 Drawing Sheets

DD detector

NDA detector

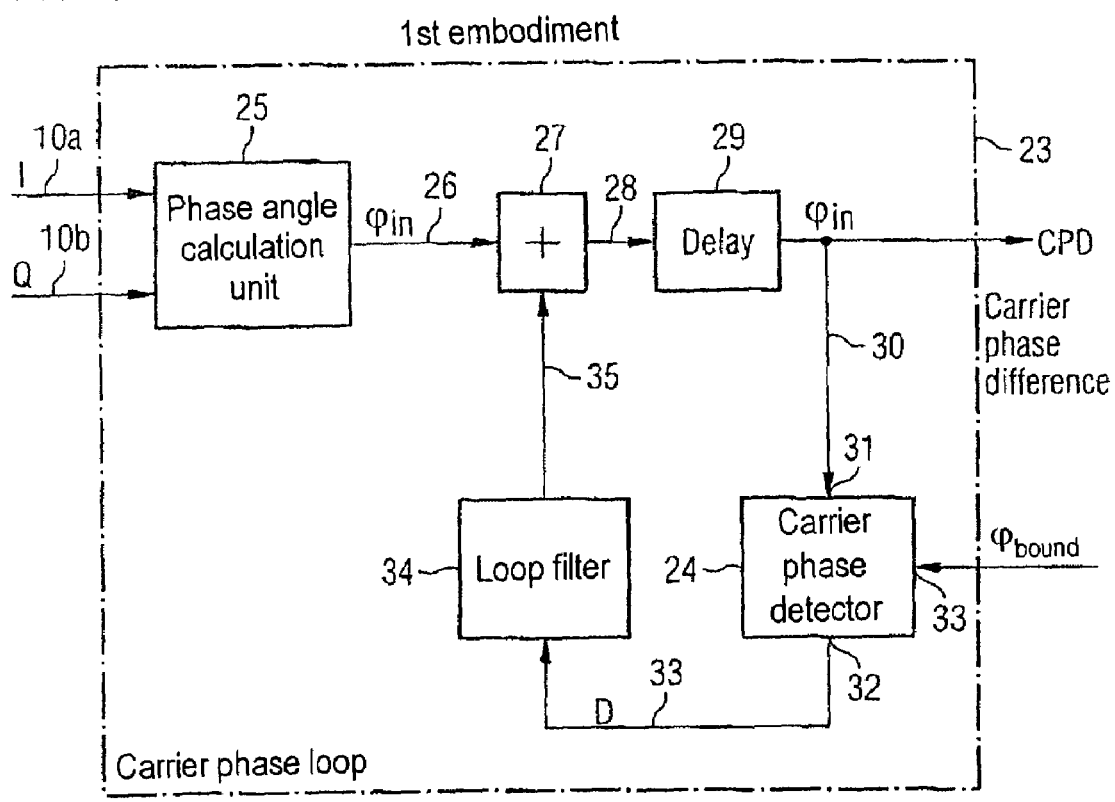

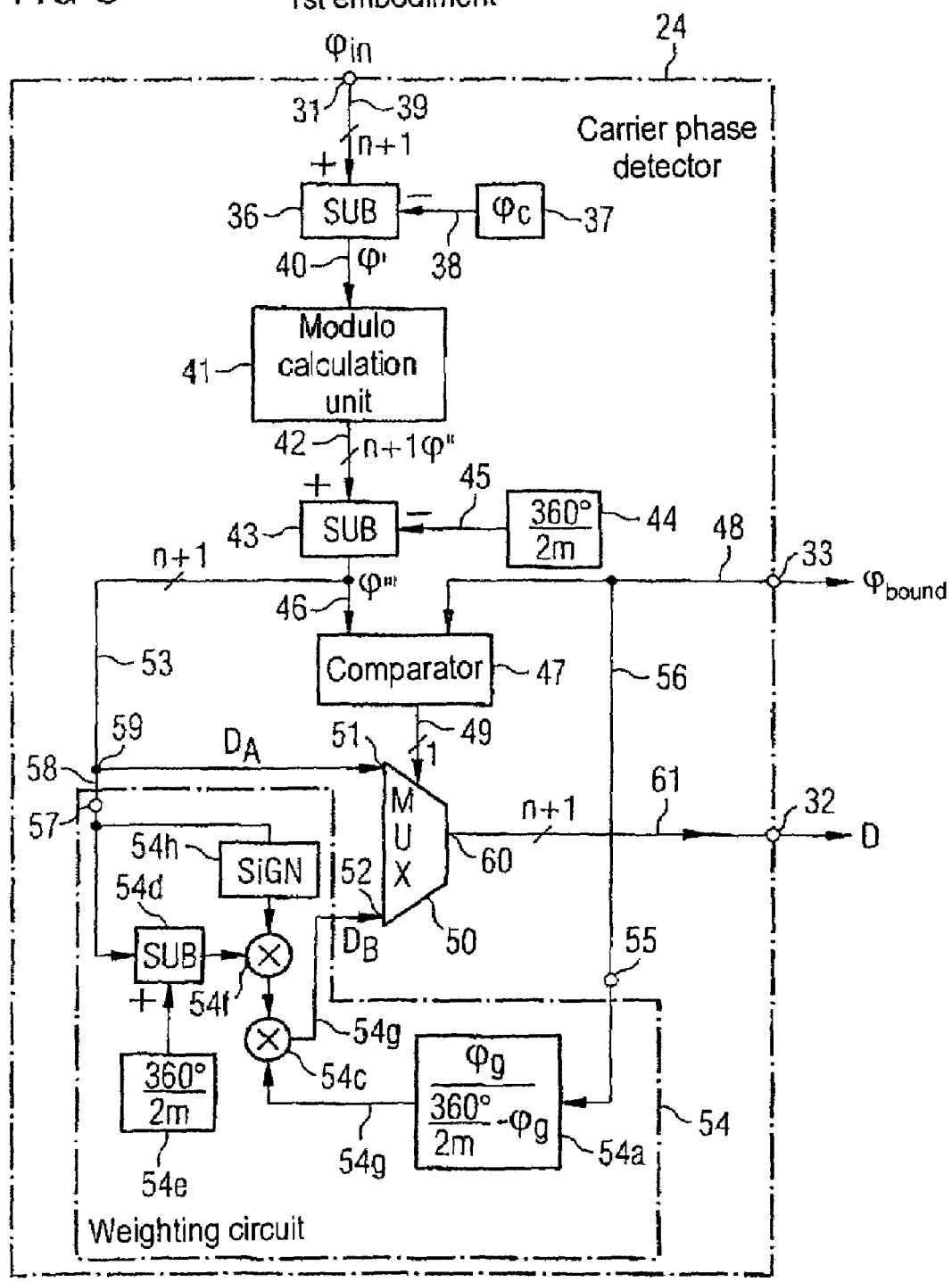

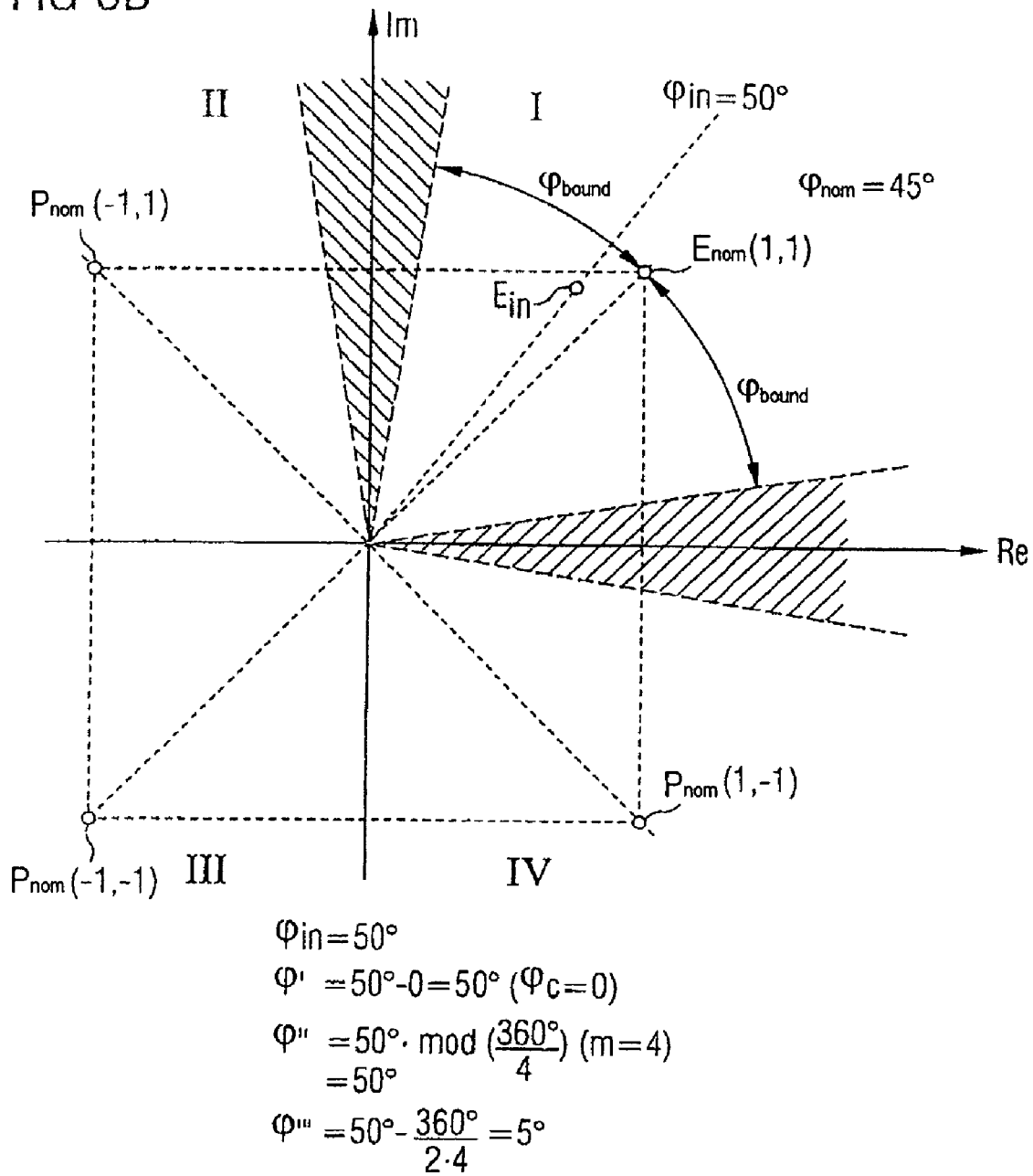

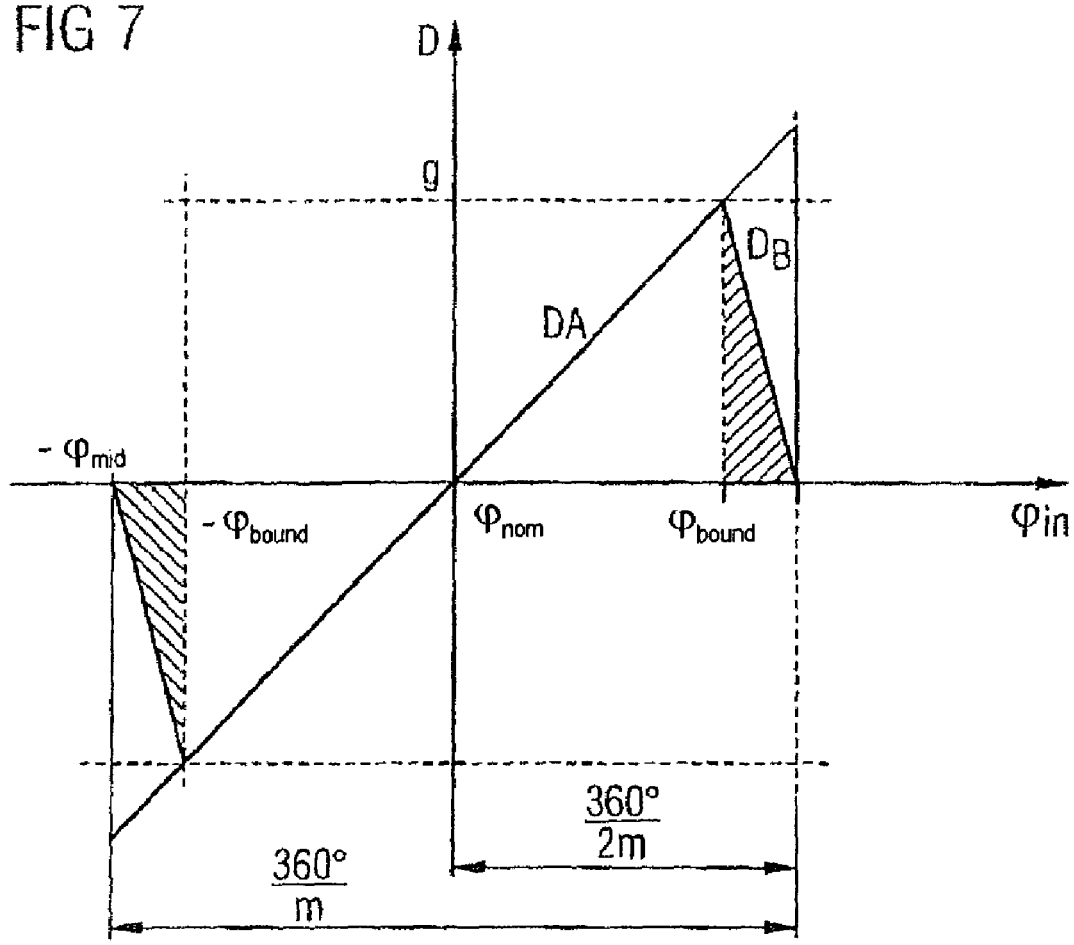

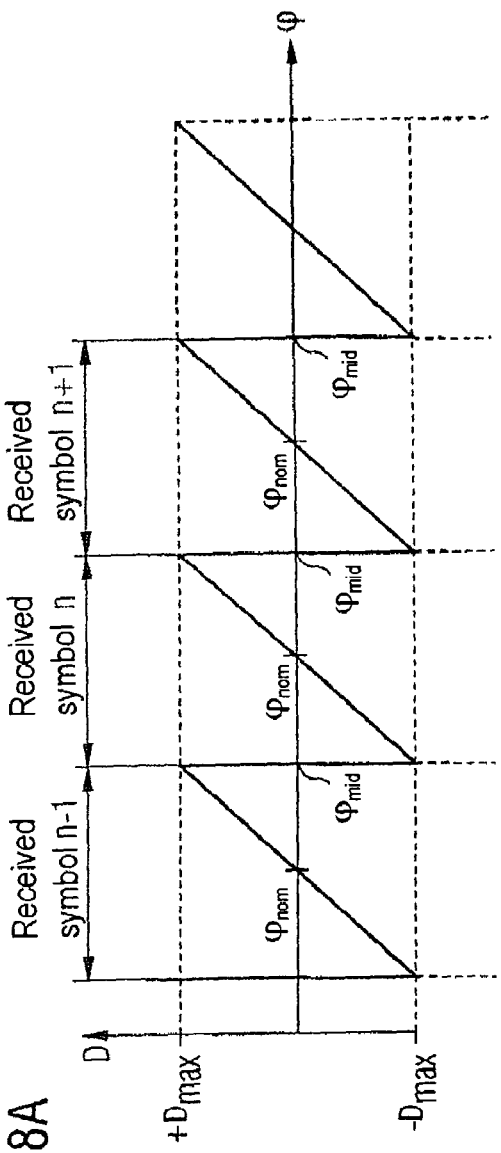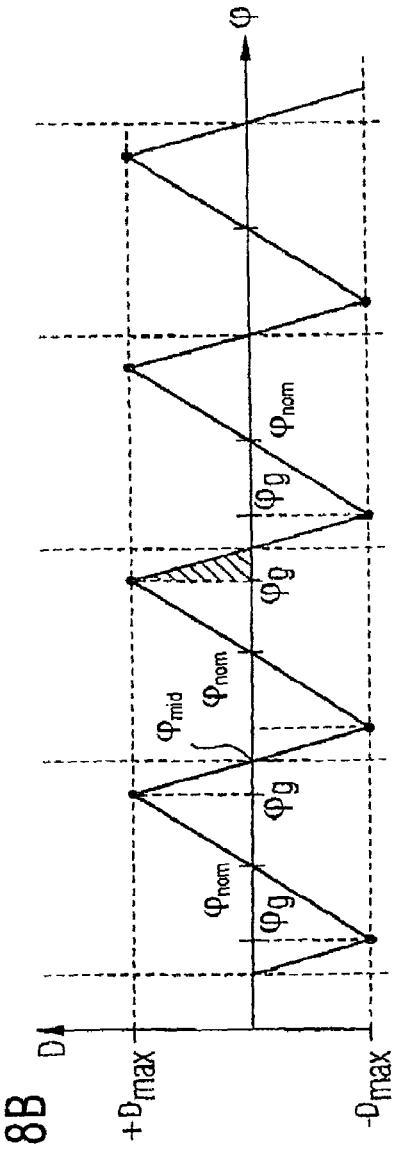
FIG 8A
FIG 8B

CARRIER PHASE DETECTOR

TECHNICAL FIELD

The invention relates to a carrier phase detector for calculation of a feedback signal for a carrier phase loop within a receiver.

BACKGROUND ART

Carrier phase detectors are conventionally subdivided into two different groups, specifically into the group of so-called DD carrier phase detectors, and into the group of so-called NDA carrier phase detectors. During the synchronization of the receiver with the carrier signal, the carrier phase and the carrier frequency of the modulated received signal are not known in advance. The phase error of the received signal from a desired nominal phase is calculated for carrier synchronization using the carrier phase detector by means of a carrier phase loop, which forms a control loop.

The received signal comprises a sequence of received data symbols, with each data symbol comprising, for example, 2 bits. In this case, the first bit indicates the real part of the transmitted data symbol, and the second bit indicates its imaginary part. The carrier phase detector calculates a feedback signal for the carrier phase loop within the receiver as a function of the real part and the imaginary part. The feedback signal is filtered by a downstream loop filter.

FIG. 1 shows the calculated feedback signal of a DD carrier phase detector based on the prior art on the complex plane, with the x axis representing the real part of the received data symbol, and the y axis representing the imaginary part of the received data symbol. The DD carrier phase detector according to the prior art weights the input data symbols linearly:

$$D = -Re\ \text{Sign}(Im) + Im \cdot \text{Sign}(Re) \qquad (1)$$

The darker the shading in FIG. 1, the more negative is the value of the feedback signal D emitted from the DD carrier phase detector.

By way of example, the following table is obtained for the following four received data symbols $E_i$:

TABLE 1

|    | $E_1$ | $E_2$ | $E_3$ | $E_4$ |
|----|-------|-------|-------|-------|
| Re | 1     | 1.1   | 0.1   | 1.9   |
| Im | 1     | 0.9   | 1.9   | 0.1   |
| D  | 0     | −0.2  | +1.8  | −1.8  |

If the received data symbol is located in the upper left-hand corner of the first quadrant on the complex plane (for example $E_3 = (0.1; 1.9)$, the value of the emitted feedback signal D has a high positive value (for example $D_3 = +1.8$).

If the received data symbol is in the right-hand lower corner of the first quadrant of the complex plane (for example $E_4 = (1.9; 0.1)$, a high negative value is emitted as the feedback signal from the carrier phase detector ($D_4 = -1.8$).

In the case of a 4 PSK-modulated signal, four equidistant nominal data symbols are defined, for example:

$$E_{nom}1 = (+1; +1);$$

$$E_{nom}2 = (-1; +1);$$

$$E_{nom}3 = (-1; -1);$$

$$E_{nom}4 = (+1; -1)$$

In this case, the four (m=4) different nominal data symbols $E_{nom}$ are located in the four different quadrants (I-IV) of the complex plane, as is illustrated in FIG. 1.

The nominal phase in the example illustrated in FIG. 1 is $E_{nom} = 45°$ for the four nominal data symbols.

The DD carrier phase detector calculates the feedback signal D for each received data symbol which has a nominal phase of $\phi = 45°$ to be D=0.

One disadvantage of DD detectors according to the prior art, which calculate the feedback signal D in accordance with equation (1), is that there is a hard transition between the individual decisions. A bright region with a high positive feedback signal value and a dark region with a relatively high negative feedback signal value D are located directly alongside one another, and can be seen from FIG. 1. In the case of a high positive feedback signal value D of, for example, +1.8, the carrier phase loop rotates in the clockwise direction, while the carrier phase loop rotates in the anticlockwise direction when the feedback signal has a high negative value of, for example, D=−1.8.

In the DD carrier phase detector according to the prior art as shown in FIG. 1, those received data symbols which are located at the boundary between the phases of two nominal data symbols are weighted more heavily than received data symbols which are located in the vicinity of the nominal phase of $\phi = 45°$. The received data symbols E3, E4, which have a relative high phase error with respect to the nominal received data symbol $E_{nom}1 = (1; 1)$ thus lead, for example, to a feedback signal D with a large amplitude, specifically of D3=+1.8 and D4=−1.8. In contrast, a received data symbol which has a relatively small phase error with respect to the nominal data symbol ($E_{nom} = (1.1)$), specifically the received data symbol E2=(1.1; 0.9), leads to a feedback signal value of D=−0.2, that is to say the amplitude of a received data symbol which has a smaller phase error with respect to the nominal received data symbol is less than the amplitude of the feedback signal D for a received data symbol which has a relatively large phase error from the nominal data symbol. Now, however, those particular received data symbols which have a relatively large phase error with respect to a nominal data symbol are relatively inaccurate. For example, a received data symbol E=(1, 0) has the same phase error with respect to the nominal data symbol in the first quadrant ($E_{nom} = (1.1)$) and with respect to the nominal data symbol in the fourth quadrant ($E_{nom}4 = (1, -1)$). The probability that a received data symbol $E_{nom}$ which is located precisely on the boundary will correspond to the first nominal data symbol $E_{nom}1$ or the fourth received data symbol is 50%. The DD phase carrier detector according to the prior art and as shown in FIG. 1 thus does not take account of the reliability probability of the received data symbol, and, accordingly, the variance of the signal amplitudes of the feedback signal D which is calculated by the DD carrier phase detector according to the prior art is relatively high. Accordingly, the power gain of the downstream digital loop filter should be designed to be less, so that the stabilization times of a carrier phase loop which uses a DD carrier phase detector according to the prior art as shown in FIG. 1 are relatively high. Thus, if the received signal changes quickly, the receiver is not able to follow the signal quickly, so that the bit error rate rises.

FIG. 2 shows a feedback signal D on the complex plane, which is calculated by means of an NDA carrier phase detector according to the prior art. An NDA carrier phase detector such as this is described, for example, by A. J. Viterbi and A. M. Viterbi "non linear estimation of PSK-modulated carrier phase with application to burst digital transmission" in IEEE TransInfoTheory volume IT-32, pages 543-551 (July 1983). The feedback signal D for Q PSK and 4 PSK is calculated using the following equation:

$$D = \frac{r^x \cdot \text{Mod}|\text{Arg}((Re + j \cdot Im)^4) + 2\pi, 2\pi| - \pi}{2}$$

where, in principle, x is freely variable, but x is normally set to be equal to zero, so that $$r = \sqrt{Re^2 + Im^2} = 1 \quad (3)$$

In the case of an NDA carrier phase detector such as this, the following values are obtained for the digital feedback signal D for four examples of received data symbols E1-E4:

TABLE 2

|    | $E_1$ | $E_2$  | $E_3$  | $E_4$  |
|----|-------|--------|--------|--------|
| Re | 1     | 1.1    | 0.1    | 1.9    |
| Im | 1     | 0.9    | 1.9    | 0.1    |
| D  | 0     | −0.199 | +1.466 | −1.466 |

The NDA carrier phase detector according to the prior art and as shown in FIG. 2 in fact has the same disadvantage as that of the conventional DD detector according to the prior art as shown in FIG. 1 in that there is a hard transition between the individual decisions.

Owing to the high signal variance of the calculated feedback signal D, the stabilization response for a carrier phase loop which has an NDA carrier phase detector such as this is relatively poor. This means that the carrier phase loop stabilizes only slowly, since the loop gain of the downstream digital loop filter must be set to be relatively low.

SUMMARY OF THE INVENTION

The object of the present invention is thus to provide a carrier phase detector for calculation of a feedback signal for a carrier phase loop in a receiver, which minimizes the stabilization time of the carrier phase loop.

According to the invention, this object is achieved by a carrier phase detector by means of the features specified in Patent claim 1.

The invention provides a carrier phase detector for calculation of a feedback signal (D) for a carrier phase loop (23) in a receiver (1), which loop detects a phase error ($\Delta\phi$) between a phase ($\phi_{in}$) of a received signal ($E_{in}$), which comprises a sequence of received data symbols, and a nominal phase ($\phi_{nom}$) of a nominal data symbol ($E_{nom}$), with the carrier phase detector (24) in each case calculating the feedback signal (D) as a function of the real part and of the imaginary part of a received data symbol ($E_{in}$), with a received data symbol ($E_{in}$) whose phase is in a boundary phase area being weighted gradually to a lesser extent during the calculation of the feedback signal (D), with the boundary phase area in each case being arranged symmetrically with respect to a mid-phase ($\phi_{mid}$) which is located in the centre between the two nominal phases ($\phi_{nom}$) of equidistant nominal data symbols ($E_{nom}$), and having a phase extent which is determined by a boundary phase ($\phi_g$).

The carrier phase detector according to the invention advantageously has a particularly smooth transition between the nominal data symbols. In this case, the carrier phase detector according to the invention furthermore, in a first embodiment, has a low amplitude dependency or, in a second embodiment, even has no amplitude dependency at all, as is the case with a DD carrier phase detector according to the prior art and as shown in FIG. 1.

In the case of one preferred embodiment, the carrier phase detector according to the invention weights a received data symbol whose phase is in the boundary phase area such that it falls linearly.

In a further embodiment, the carrier phase detector weights a received data symbol whose phase is in a boundary phase area such that it falls in accordance with the square law.

In one embodiment, the carrier phase detector according to the invention detects the phase of a PSK-modulated received data symbol.

The received data symbols are in this case preferably each 4 PSK-, 8 PSK- or 16 PSK-modulated.

In one preferred embodiment, the carrier phase loop has a phase angle calculation unit which calculates the phase $\phi$ of the received data symbol from the real part and from the imaginary part of the received data symbol $E_{in}$.

One preferred embodiment of the carrier phase detector according to the invention has a first phase subtractor, which subtracts a constant, variable phase ($\phi_c$ from the calculated phase of the received data symbol $E_{in}$, in order to produce a first mapped phase.

In one preferred embodiment, the carrier phase detector also has a phase rotation unit, which rotates the mapped first phase $\phi'$ into the first quadrant of the complex plane in order to produce a second mapped phase $\phi''$.

In one preferred embodiment of the carrier phase detector according to the invention, the carrier phase detector has a second phase subtractor which subtracts half the phase separation between two equidistant nominal data symbols from the second mapped phase $\phi''$ in order to produce a third mapped phase $\phi'''$.

One preferred embodiment of the carrier phase detector has a comparator which compares the mapped third phase $\phi'''$ with a variable boundary phase $\phi_g$ in order to produce a control signal.

In one particularly preferred embodiment of the carrier phase detector according to the invention, this carrier phase detector contains a weighting circuit, which calculates a weighted feedback signal as a function of the third mapped phase $\phi'''$ and the variable boundary phase $\phi_g$ where:

$$D_B = \frac{\left[\text{Sign}(\varphi''') \cdot \left(\frac{360°}{2m} - \varphi'''\right)\right] \cdot \varphi_{bound}}{\left(\frac{360°}{2m}\right) - \varphi_{bound}} \quad (4)$$

where m is the number of equidistant nominal data symbols on the complex plane.

In one preferred embodiment of the carrier phase detector according to the invention, this carrier phase detector has a multiplexer which is driven by the control signal produced by the comparator, with the multiplexer passing on a feedback signal $D_a$, which is proportional to the third mapped phase $\phi'''$, to an output of the carrier phase detector when the comparator finds that the third mapped phase $\phi''''$ is less than the boundary phase $\phi_g$, with the multiplexer passing on the feedback signal $D_b$, which is calculated by the weighting circuit, to the output of the carrier phase detector when the comparator finds that the third mapped phase φ'" is greater than the boundary phase $\phi_g$.

The carrier phase detector preferably has a downstream digital loop filter.

Furthermore, preferred embodiments of the carrier phase detector according to the invention will be described in order to explain the features which are significant to the invention.

BRIEF DESCRIPTION OF THE DRAWINGS

FIG. 4 shows a block diagram of a carrier phase loop, which contains a first embodiment of a carrier phase detector according to the invention;

FIG. 5 shows a block diagram which illustrates the first embodiment of the carrier phase detector according to the invention in detail;

FIG. 6b shows a diagram to explain the method of operation of the first embodiment of the carrier phase detector according to the invention;

FIG. 7 shows a characteristic of the first embodiment of the carrier phase detector according to the invention;

FIGS. 8a, 8b show characteristics in order to explain the method of operation of the first embodiment of the carrier phase detector according to the invention;

DETAILED DESCRIPTION OF THE INVENTION

Figure 1:
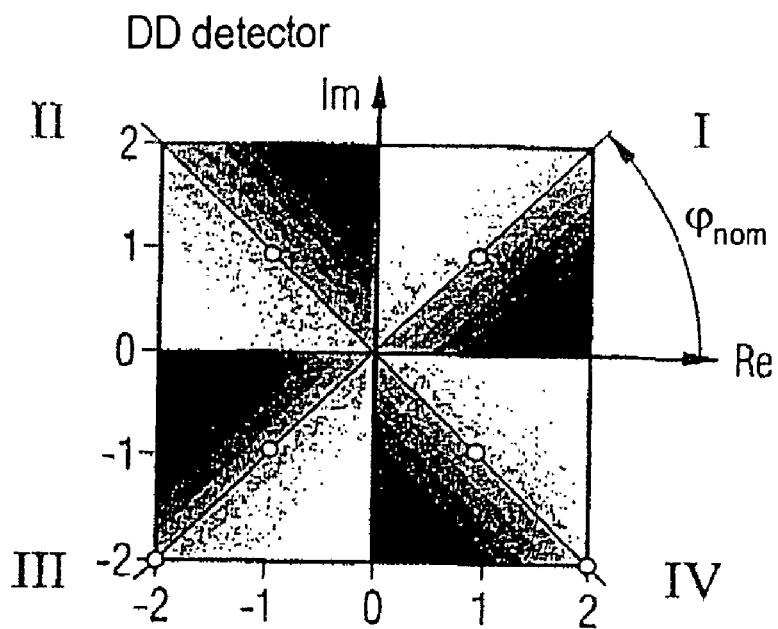
FIG. 1 shows a diagram in order to explain the method of operation of a conventional DD carrier phase detector according to the prior art.
Figure 2:
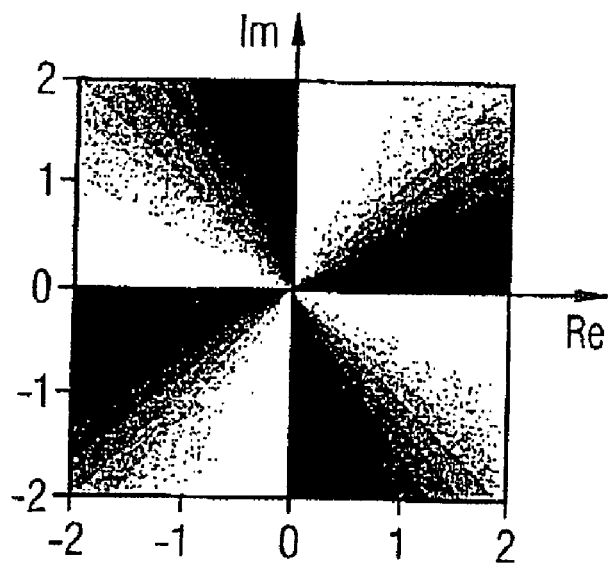
FIG. 2 shows a diagram in order to explain the method of operation of a conventional NDA carrier phase detector according to the prior art.
Figure 3:
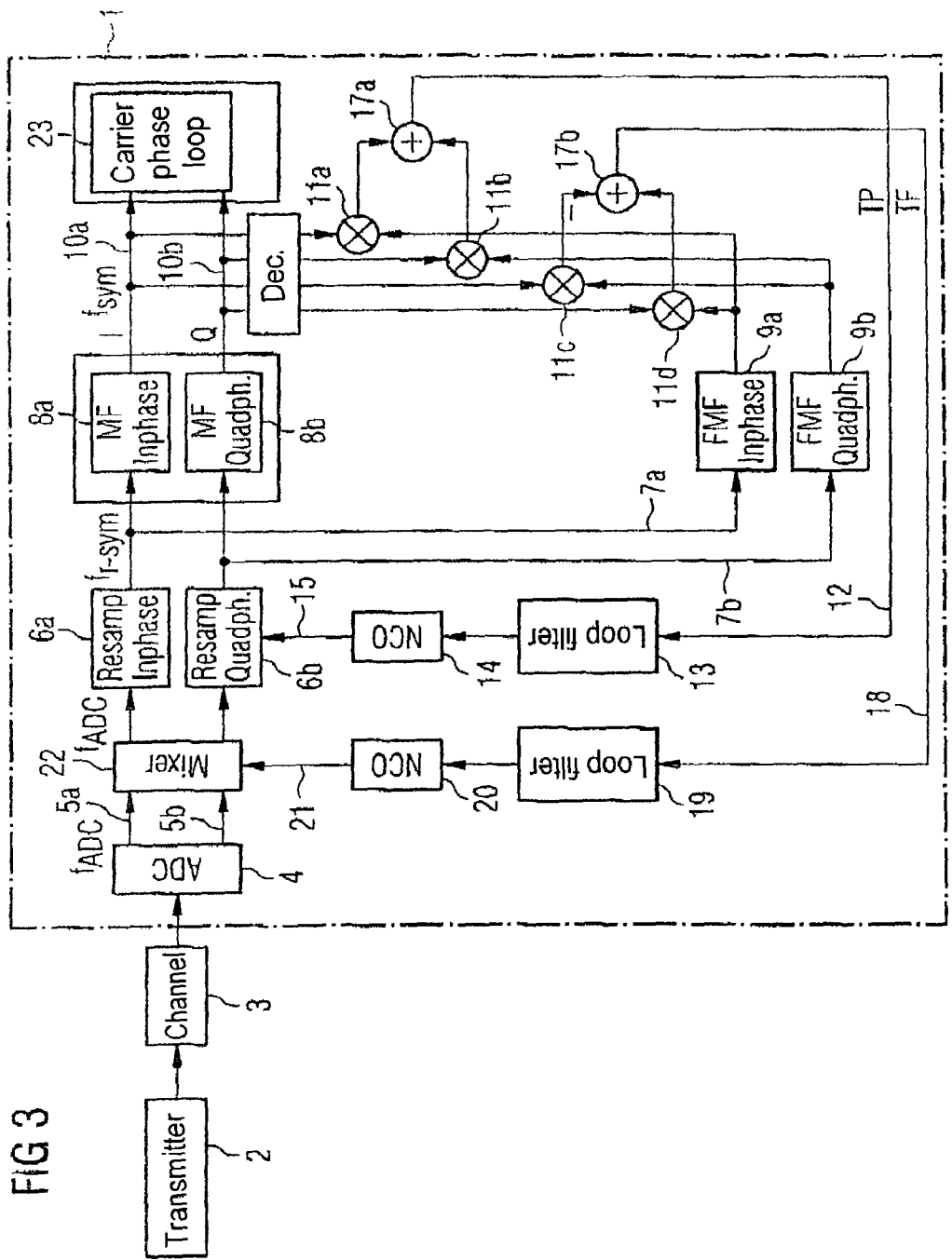
FIG. 3 shows a block diagram of a receiver which contains a carrier phase loop with a carrier phase detector according to the invention integrated in it.

FIG. 3 shows a receiver 1 with a carrier phase loop 23, in which a carrier phase detector according to the invention is integrated. In the embodiment illustrated in FIG. 3, the receiver 1 receives an analogue received signal via a transmission channel 3 from a transmitter 2. The analogue received signal is converted to a digital received signal by an integrated analogue/digital converter 4. The digital received signal is emitted at a data symbol rate $f_{ADC}$ via internal lines 5a, 5b to resampling filters 6a, 6b. The resampling filters 6a, 6b carry out a keying process, and emit a digital output signal via lines 7a, 7b to downstream matched filters 8a, 8b.

The digital output signal from the resampling filters 6 is greater by a predetermined factor r than the data symbol rate of the digital input signal emitted from the analogue/digital converter 4. The matched filters 8a, 8b are matched to the transmission channel 3 and to the transmitter 2, and if appropriate to an equalizer circuit. In this case, the magnitude of the convolution product from the impulse response of the transmission filter that is contained in the transmitter 2, of the transmission channel 3 and, if appropriate, of the equalizer, and of the matched filters 8a, 8b is a maximum in order to maximise the signal-to-noise power ratio SNR of the received signal at the nominal sampling times.

In addition to the matched filters 8a, 8b, the receiver 1 contains parallel-connected frequency matched filters 9a, 9b. The transfer functions of the frequency matched filters 9a, 9b are matched to the transfer functions of the matched filters 8a, 8b, with the transfer function FMF (f) of the frequency matched filters 9a, 9b in the frequency domain being equal to the first derivative of the transfer function MF (f) of the matched filters 8a, 8b. The matched filters 8a, 8b emit a filtered digital input signal via lines 10a, 10b to the carrier phase loop 23. In this case, the data symbol rate of the matched filters 8a, 8b is equal to the data symbol rate of the digital input signal that is emitted from the analogue/digital converter 4. The frequency matched filters 9a, 9b are designed to provide a decimation function, so that the subsequent multiplication is carried out using the data symbol pattern.

The receiver 1 furthermore contains multipliers 11, which multiply the digital output signals in the matched filters 8a, 8b (which, if appropriate, are decimated in frequency terms by a decimation filter to the data symbol rate) by the digital output signal from the frequency matched filters 9a, 9b to form a clock phase error detection signal TP. The clock phase error detection signal TP is emitted, after addition by means of an adder 17, via a line 12 to a downstream digital loop filter 13. The digital loop filter 13 is followed by an NCO (numerian control oscillator) 14, which emits a digital control signal to the resampling filters 6a, 6b via a control line 15. The resampling filters 6a, 6b are set as a function of the filtered clock phase error detection signal TP. The clock phase detection is carried out in the receiver 1 on the basis of the digital output signal from the matched filters 8a, 8b and from the frequency matched filters 9a, 9b. The data symbol rate of the output signals from the filters 8, 9 is higher than the data symbol rate of the digital input signal. The two filters 8, 9 have a decimating function, that is to say the data symbol rate of their output signal is lower than the data symbol rate of the received digital input signal. The filters 8, 9 preferably have the same group delay time.

The carrier phase loop 23 within the receiver 1 is a control loop which controls the carrier phase of the received signal to the nominal phase of predetermined nominal data symbols within the complex plane.

FIG. 4 shows the carrier phase loop 23 with a first embodiment of a carrier phase detector 24. The carrier phase loop 23 receives the filtered received signal via the lines 10a, 10b from the matched filters 8a, 8b. The received signal comprises a sequence of received data symbols. Each received data symbol $E_{in}$ has a real part I and an imaginary part Q.

In the first embodiment illustrated in FIG. 4, the carrier phase loop 23 contains a phase angle calculation unit 25. The phase angle calculation unit 25 calculates the phase $\phi_{in}$ of the received data symbol ($E_{in}$) from the real part (I) and the imaginary part (Q) of the applied received data symbol $\phi E_{in}$, and emits the calculated phase angle pin as a digital value via an output line 26. The output line 26 of the phase angle calculation unit 25 is connected to a first input of an adder 27. The adder 27 has an output which is connected to a delay circuit 29 via a line 28. The output of the delay circuit 29 is connected via a line 30 to a signal input 31 of the first embodiment of the carrier phase detector 24 according to the invention. The carrier phase detector 24 has a detector output 32, which is connected to a downstream digital loop filter 34 via a feedback line 33. The digital loop filter 34 is connected on the output side via a line 35 to a second input of the adder 27.

In addition to the detector input 33 and the detector output 32, the carrier phase detector 24 has a control input 33, via which a variable boundary phase $\phi_g$ is applied. In one embodiment, the boundary phase $\phi_g$ is programmable. The carrier phase detector 24 preferably has a memory device for temporary storage of the programmable phase boundary value $\phi_g$.

FIG. 5 shows a block diagram of the first embodiment of the carrier phase detector 24 according to the invention.

The carrier phase detector 24 is used to calculate the feedback signal D, which is emitted at the detector output 32. This feedback signal D is emitted as the output signal from the carrier phase detector 24 via the line 33 to the downstream digital loop filter 34 within the carrier phase loop 23.

The carrier phase detector 24 contains a first phase subtractor 36, which subtracts a constant, variable phase $\phi_c$ from the calculated input phase $\phi_{in}$ of the currently applied received data symbol $E_{in}$, which is calculated by the phase angle calculation unit 25, in order to produce a first mapped phase $\phi'$. The constant phase $\phi_c$ is preferably stored in a programmable memory device 37. The memory device 37 is connected via lines 38 to the first phase subtractor 36. The phase subtractor 36 is also connected on the input side via lines 29 to the detector input 31. On the output side, the phase subtractor 36 is connected via lines 40 to a phase rotation unit 41, which rotates or maps the mapped first phase $\phi'$, which is calculated by the first phase subtractor 36, into the first quadrant of the complex plane, in order to produce a second mapped phase $\phi''$ by means of a modulo operation.

On the output side, the phase rotation unit 41 is connected via lines 42 to a second phase subtractor 43, which subtracts half the phase separation between two equidistant nominal data symbols $E_{nom}$ from the second mapped phase $\phi''$, which is emitted from the phase rotation unit 41, in order to produce a third mapped phase $\phi40$ '". If the number of nominal data symbols $E_{nom}$ within the complex plane is m, then half the phase separation between two equidistant nominal data symbols is 360°/2 m. In the case of a 4 PSK-modulated signal, by way of example, four equidistant nominal data symbols are provided, whose phase separation from one another is 90°. Half the phase separation is thus 45°. In one preferred embodiment, half the phase separation of 360°/2 m is stored in a further programmable memory unit 44, which is connected via lines 45 to a second phase subtractor 43. The second phase subtractor 43 emits the calculated third mapped $\phi'''$ via a line 46 to a first input of a comparator 47. The comparator 47 has a second input, which is connected via lines 48 to the set input 33 of the carrier phase detector 44. The comparator 47 compares the third mapped phase $\phi'''$ with the applied or programmed boundary phase $\phi_g$ in order to produce a control signal which is emitted via a control line 49 to a control input of a multiplexer 50.

The multiplexer 50 has a first multiplexer input 51 and a second multiplexer input 52. The first multiplexer input 51 is connected via lines 53 to the output of the second phase subtractor 43, and receives the third mapped phase $\phi'''$. The second multiplexer input 52 receives a weighted feedback signal from a weighting circuit 54 within the carrier phase detector 24. The weighting circuit 54 has a first signal input 55, which receives the variable phase boundary value $\phi_{bound}$ via a line 56. The weighting circuit 54 has a further signal input 57, which is connected via a line 58 to a branch node 59 of the line 23. The weighting circuit 54 receives the third phase $\phi'''$, which is calculated by the second phase subtraction device 43, via the second input 57. The multiplexer 50 also has an output 60, which is connected via lines 61 to the detector output 32.

The weighting circuit 54 calculates a weighted feedback signal $D_b$ as a function of the third mapped phase $\phi'''$, which is applied to the signal input 57, and of the variable boundary phase $\phi_g$, which is applied to the input 55, in which case:

$$D_B = \frac{\left[\text{Sign}(\varphi''') \cdot \left(\frac{360°}{2m} - \varphi'''\right)\right] \cdot \varphi_{bound}}{\left(\frac{360°}{2m}\right) - \varphi_{bound}} \quad (4)$$

For this purpose, the weighting circuit 54 contains a calculation block 54a, whose output is connected via a line 54b to a first multiplier 54c. Furthermore, the weighting circuit 54 contains a subtractor 54d, which subtracts the third mapped phase angle $\phi'''$ from half the phase separation 360°/2 m, which is preferably stored in a programmable memory device 54e. The output of the subtractor 54d is connected to a further multiplier 54f within the weighting circuit 54. The output of the multiplier 54f is connected to the second signal input of the multiplier 54c, whose output is itself connected via a line 54g to the second multiplexer input 52. A mathematical sign calculation unit 54h in the weighting circuit 54 calculates the mathematical sign (SIGN) of the third mapped phase $\phi'''$, and emits this to the second input of the multiplier 54f.

The multiplexer 50 of the carrier phase detector 24 is driven by the control signal that is produced by the comparator 47, and switches between its two signal inputs 51 and 52. The multiplexer 50 passes on a feedback signal $D_a$, which is proportional to the third mapped phase $\phi'''$, to the output 32 of the carrier phase detector 24 when the comparator 47 finds that the third mapped phase $\phi'''$ is less than the applied boundary phase $\phi_g$.

Conversely, the multiplexer 50 passes on the feedback signal $D_b$, which is calculated by the weighting circuit 54, to the output 32 of the carrier phase detector 24 when the comparator 47 finds that the third mapped phase $\phi'''$ is greater than or equal to the boundary phase $\phi_g$.

In the first embodiment of the carrier phase detector 24 as illustrated in FIG. 5, the phase angle or angle information is processed without amplitude information. The function of the carrier phase detector 24 as shown in FIG. 5 can be described by the following equations:

$$\varphi_{in} = \arctan\left(\frac{\text{Im}}{\text{Re}}\right)$$

$$\varphi''' = \left\{(\varphi_{in} - \varphi_c) \bmod\left(\frac{360°}{m}\right)\right\} - \frac{360°}{2m}$$

IF$\{\text{Abs}(\varphi''') < \varphi_g\}$ THEN $D = \varphi'''$

ELSE $D = \left\{\text{Sign}(\varphi''')\left(\left[\frac{360°}{2m}\right] - \varphi'''\right)\right\} \cdot \frac{\varphi_g}{\left(\frac{360°}{2m}\right) - \varphi_g}$ where Im represents the imaginary part of the received data symbol $E_{in}$, and Re represents the real part of the received data symbol, where $\phi_c$ represents a constant phase for fine adjustment, and where $\phi_g$ is a preferably externally programmable cut-off frequency. The number of equidistant nominal data symbols is m, with m being equal to 4 for QPSK, m being equal to 8 for 8 PSK, and m being equal to 16 for 16 PSK.

Figure 6A:
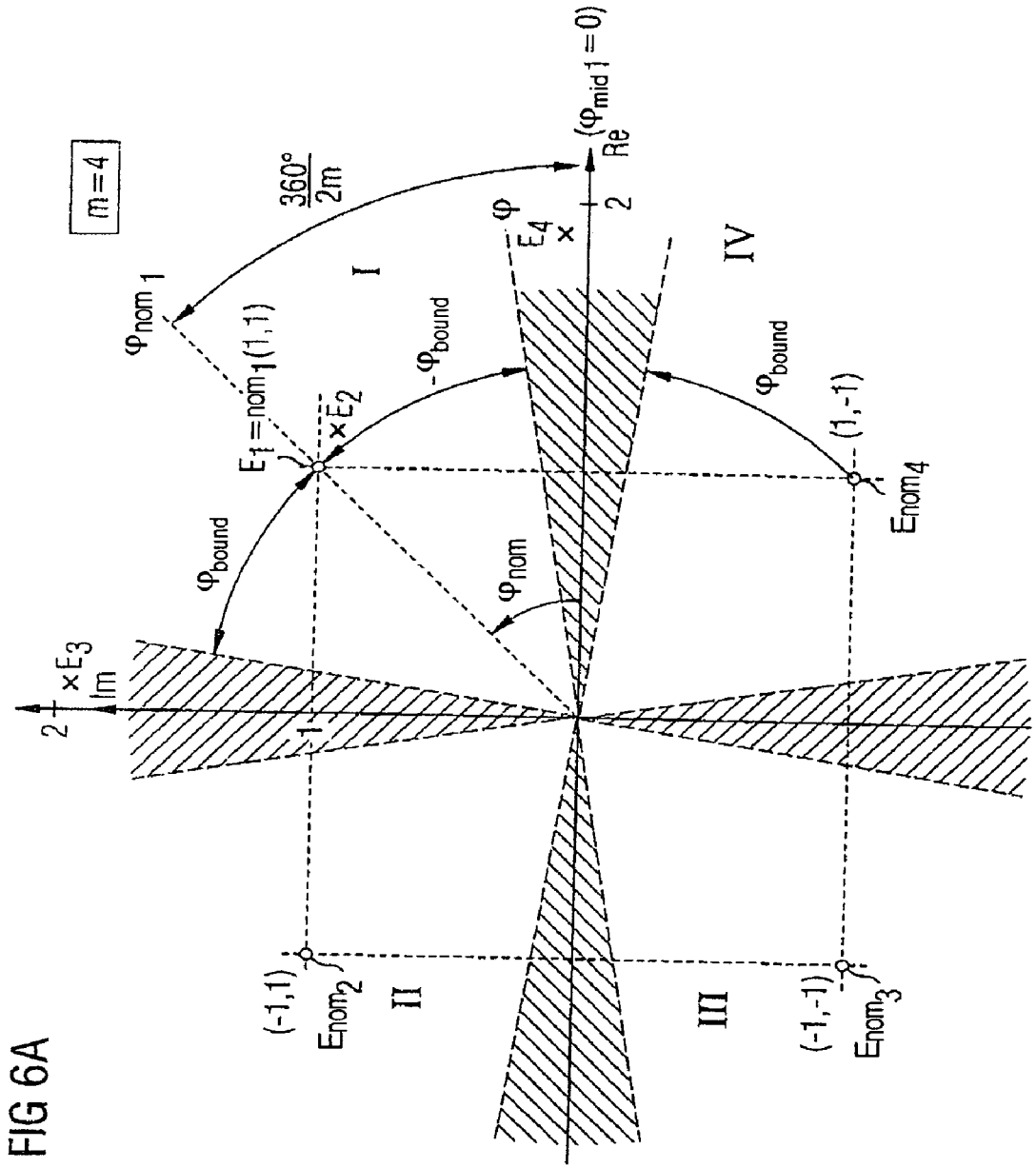
FIG. 6a shows a diagram to explain the method of operation of the first embodiment of the carrier phase detector according to the invention.

FIG. 6a will be used to explain the method of operation of the carrier phase detector 24 according to the invention for the situation in which a Q PSK modulated received signal is being received. FIG. 6a shows the complex plane with four quadrants I-IV, with one nominal received data symbol $F_{nom}$ being located in each quadrant. In the case of Q PSK, that is to say when m=4, the phase separation between two nominal data symbols is $E_{nom}360°/m=90°$. The boundary between two decision ranges is determined by a mid-phase $\phi_{mid}$, which is located in the centre between the two nominal phases of equidistant nominal data symbols, with this mid-phase in each case being separated from an equidistant nominal data symbol by half the phase separation between the nominal data symbols, that is to say the phase separation $\Delta\phi$ between the mid-phase $\phi_{mid}$ and the nominal phase ($\phi_{nom}$ of the nominal data symbol is 360°/2 m. In the example illustrated in FIG. 6a, the separation between the mid-phase $\phi_{mid}$ and the nominal phase is 45°. The mid-phase, which represents the boundary between the decision ranges for the first nominal data symbol $E_{nom}1$ in the quadrant I and the fourth nominal data symbol $E_{nom}4$ in the quadrant IV is $\phi_{mid}=0°$ in the example illustrated in FIG. 6a. The further mid-phases in the example illustrated in FIG. 6a are $\phi_{mid}2=90°$, $\phi_{mid}3=180°$ and $\phi_{mid}4=270°$.

In a corresponding manner, the carrier phase loop 23, which contains the carrier phase detector 24, controls the carrier phase to the nominal phase $\phi_{nom}1$ of the first nominal data symbol $E_{nom}1$ for each received data symbol which is located in the first quadrant of the complex plane as shown in FIG. 6a. For this purpose, the carrier phase detector 24 calculates a feedback signal D, which is emitted to the downstream digital loop filter 34, as a function of the real part and the imaginary part of the received data symbol $E_{in}$.

In the carrier phase detector 24 according to the invention, however, those received data symbols $E_{in}$ whose phase $\phi_{in}$ is located in one of the boundary phase areas, which are shown in a shaded form, are weighted to a gradually lesser extent in the calculation of the feedback signal D. The boundary phase areas which are shown in a shaded form are in each case symmetrical with respect to a mid-phase, which is located in the centre between the two nominal phases of equidistant nominal data symbols $E_{nom}$. The phase extent of a boundary phase area is defined by the variable boundary phase $\phi_g$.

In the example illustrated in FIG. 6a, the receiver 1 sequentially receives four received data symbols E1, E2, E3, E4. In this case, the first received data symbol E1 corresponds precisely to the nominal data symbol $E_{nom}1$, and the second received data symbol is in the vicinity of the nominal data symbol $E_{nom}1$, and thus has a relatively small phase error with respect to the nominal phase $\phi_{nom}1$. The two other received data symbols E3, E4 are in boundary phase areas. In this example, the carrier phase detector 24 calculates the feedback signal D in accordance with the following table:

TABLE 3

|  | E1 | E2 | E3 | E4 |
|---|---|---|---|---|
| Re | 1 | 1.1 | 0.1 | 1.9 |
| Im | 1 | 0.9 | 1.9 | 0.1 |
| ArcTan(Re/Im) | 0.785 | 0.885 | 0.053 | 1.518 |
| D | 0 | −0.1 | 0.1 | −0.1 |

As can be seen from Table 3, a digital feedback signal of D=0 is calculated for that value which corresponds precisely to the nominal data symbol and thus has no phase error between it and the nominal phase. The received data symbols E3, E4 which are located in the two boundary phase areas are weighted relatively weakly. For E3=(0.1; 1.9), the carrier phase detector calculates a feedback signal of D=0.1, and for E4=(1.9; 0.1), the carrier phase detector 24 calculates a digital feedback signal of D=−0.1.

If Table 3 is compared with Table 1 for the DD carrier phase detector according to the prior art and Table 2 for the NDA carrier phase detector according to the prior art, it can be seen that the variance of the feedback signal D, which is calculated by the carrier phase detector 24 according to the invention, is considerably less than that of the feedback signal D in the conventional carrier phase detectors. Short disturbance pulses or received data symbols which are located in the boundary phase areas are weighted relatively weakly by the carrier phase detector 24 according to the invention. The carrier phase detector 24 according to the invention thus weakly weights relatively unreliable received data symbols which are located in the boundary phase areas. The small variance in the feedback signal D which results from it means that the loop gain of the downstream digital loop filter 34 can be set to be relatively high. This means that the stabilization time of the carrier phase loop 23 is short, so that the receiver has a better stabilization response.

In the embodiment of the carrier phase detector 24 according to the invention described in conjunction with FIG. 5, a received data symbol whose phase is in a boundary phase area is weighted such that it falls linearly by the carrier phase detector 24.

In one alternative embodiment of the carrier phase detector 24 according to the invention, a received data symbol whose phase is in a boundary phase area is weighted by the carrier phase detector 24 such that it falls in accordance with the square law.

FIG. 6b will be used to explain the method of operation of the first embodiment of the carrier phase detector 24, as it is illustrated in FIG. 5. The method of operation of the carrier phase detector 24 will be explained step by step with reference to one received data symbol.

The phase signal $\phi_{in}$ (calculated by the phase angle calculation unit 25) of the received data symbol $E_{in}$ occurs at 50° in the example illustrated in FIG. 6b. The nominal phase of the nominal data symbol $E_{nom}=(1.1)$ is 45°. The first phase subtractor 36 receives the calculated phase $\phi_{in}$ and subtracts a constant variable adjustment phase $\phi_c$ from it in order to produce a first mapped phase $\phi'$. In the chosen example, it is assumed that $\phi_c=0$. The mapped first phase $\phi'$ is supplied to the phase rotation unit 41, which rotates the mapped first phase $\phi'$ into the first quadrant (I) of the complex plane in order to produce a second mapped phase $\phi''$. This is done by the phase rotation unit 41 carrying out a modulo operation. In the chosen example, the phase of the received data symbol is already located in the first quadrant of the complex plane, so that the second phase $\phi''$ is equal to the first mapped phase $\phi'$, and is 50°.

The second phase subtractor 43 then subtracts half the phase separation between two equidistant nominal data symbols from the second mapped phase $\phi''$ in order to produce a third mapped phase $\phi'''$. Half the phase separation between two equidistant nominal data symbols $I_{nom}$ is 45° in the example illustrated in FIG. 6b, in which m=4. The third mapped phase $\phi'''$, which is emitted from the second phase subtractor 43, is thus 50°−45°=5°.

The comparator 47 compares the third mapped phase $\phi'''$ with a variable boundary phase $\phi_{bound}$, which, by way of example, is 40° in the illustrated example.

Since the third mapped phase $\phi'''=5°$ is less than the boundary phase $\phi_g=40°$, the comparator 47 produces a control signal which is applied to the multiplexer 50 and switches the first input 51 of the multiplexer to the output of the multiplexer 60. The feedback signal D which is emitted from the carrier phase detector 24 at its output 32 is thus a signal (D=D$_a$) which is proportional to the third mapped phase φ'''. Thus, if the received data symbol E$_{in}$ is not in the boundary phase area, the multiplexer 50 emits a feedback signal D$_a$ which is proportional to the phase error between the received data symbol E$_{in}$ and the nominal data symbol E$_{nom}$. The phase error Δφ between the received data symbol E$_{in}$ and the nominal data symbol E$_{nom}$ in the example illustrated in FIG. 6b is 5°. The output signal D$_a$ from the carrier phase detector 24 is proportional to this calculated phase error.

Conversely, if the received data symbol E$_{in}$ is in a boundary phase area, the received data symbol is weighted in a linearly falling manner by the carrier phase detector. The multiplexer 50 in this case is connected by the comparator 47 to the second input 52, and emits the output signal from the weighting circuit 54 to the output 32 of the carrier phase detector 24. The weighted feedback signal D$_b$ which is calculated by the weighting circuit 54 is in this case:

$$D_B = \frac{\left[\text{Sign}(\varphi''') \cdot \left(\frac{360°}{2m} - \varphi'''\right)\right] \cdot \varphi_{bound}}{\left(\frac{360°}{2m}\right) - \varphi_{bound}} \quad (4)$$

FIG. 7 shows the characteristic of the first embodiment of the carrier phase detector 24 according to the invention, as illustrated in FIG. 5.

In a first phase range, which is located around the nominal phase φ$_{nom}$ of a nominal data symbol, the characteristic rises linearly in proportion to the phase of the received signal. As soon as the variable boundary phase φ$_{bound}$ is reached, the characteristic of the calculated feedback signal D falls linearly until the mid-phase φ$_{mid}$ between two received data symbols is reached. The characteristic which is illustrated in FIG. 7 shows a linear fall in the characteristic in the boundary phase area. In an alternative embodiment, the received data symbols in the boundary phase area are weighted such that they fall in accordance with a square law.

FIGS. 8a, 8b show the characteristic profile for a sequence of received data symbols in the case of a conventional DD carrier phase detector according to the prior art, and for a carrier phase detector 24 according to the invention. In the case of the conventional DD carrier phase detector, there is a hard transition at the boundaries between the received data symbols, as can be seen in FIG. 8a. If the phase of a received data symbol is in the vicinity of the mid-frequency, which is in each case located in the centre between two nominal phases of equidistant nominal data symbols, a feedback signal D with an amplitude +D$_{max}$ or with an amplitude of –D$_{max}$ can be emitted if the phase fluctuation of the DD carrier phase detector is very small. In a corresponding manner, the variance of the feedback signal D in the case of a DD carrier phase detector such as this according to the prior art is relatively high. Furthermore, those received data symbols which occur in the boundary phase area and are thus actually particularly unreliable are weighted particularly heavily.

In contrast, FIG. 8b shows the profile of the characteristic of the carrier phase detector 24 according to the invention over a number of received symbol boundaries. As can be seen well from FIG. 8b, there is a smooth transition at the boundary between two received data symbols of the carrier phase detector 24 according to the invention, that is to say the characteristic shown in FIG. 8a has no sudden amplitude changes. Received data symbols whose phase is in a boundary phase area are weighted gradually to a lesser extent, in a linearly falling manner.

Figure 9A:
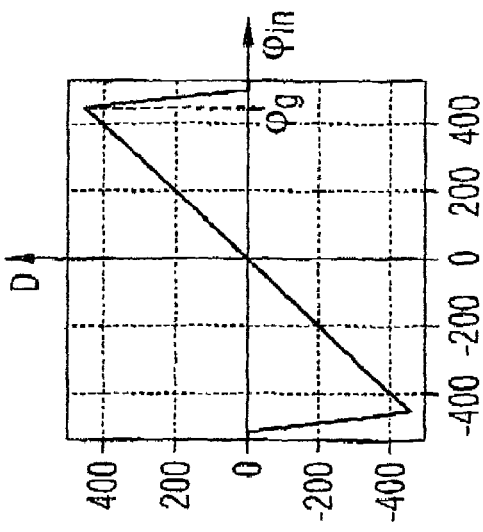
FIG. 9 shows further characteristics in order to explain the method of operation of the first embodiment of the carrier phase detector according to the invention.
Figure 9B:
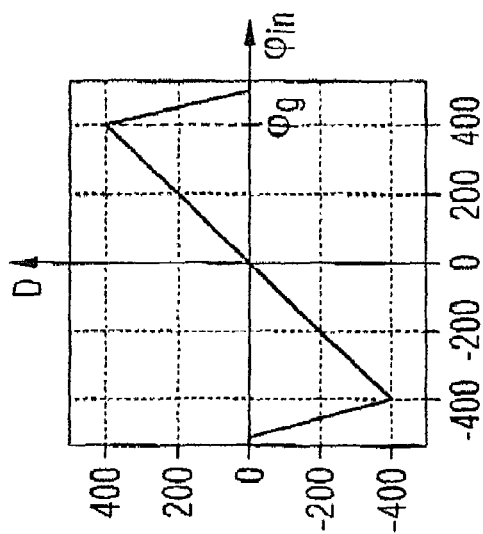
Figure 9C:
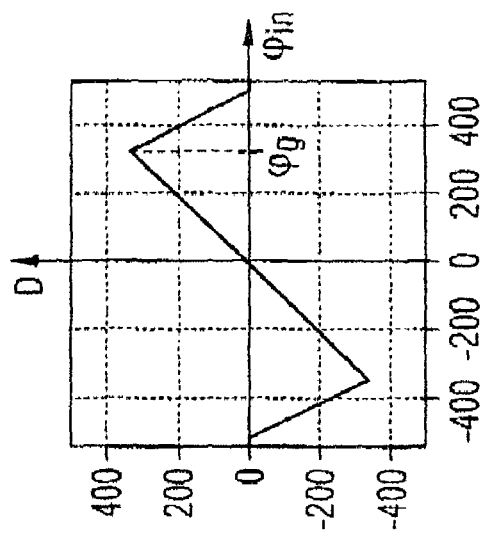

FIG. 9 shows further characteristics of the carrier phase detector 24 according to the invention. The carrier phase detector 24 receives the calculated received phase φ$_{in}$ via n+1 data lines, where n in the illustrated example is nine (n=9). In a corresponding manner, the received nominal phase in the example illustrated in FIG. 9 is resolved into 1024 bit steps. If, for example, the mid-frequency is 45°, this corresponds to a bit value of 512. The characteristic of the carrier phase detector 24 is varied by changing the variable boundary frequency φ$_{bound}$. FIG. 9a shows a relatively high phase boundary value φ$_{bound}$, while FIG. 9c shows a relatively low phase boundary value φ$_{bound}$. The characteristic of the carrier phase detector can be adjusted by varying the boundary frequency φ$_{bound}$, in which case the characteristic setting is the governing factor for the stabilization response of the carrier phase loop 23.

Figure 10:
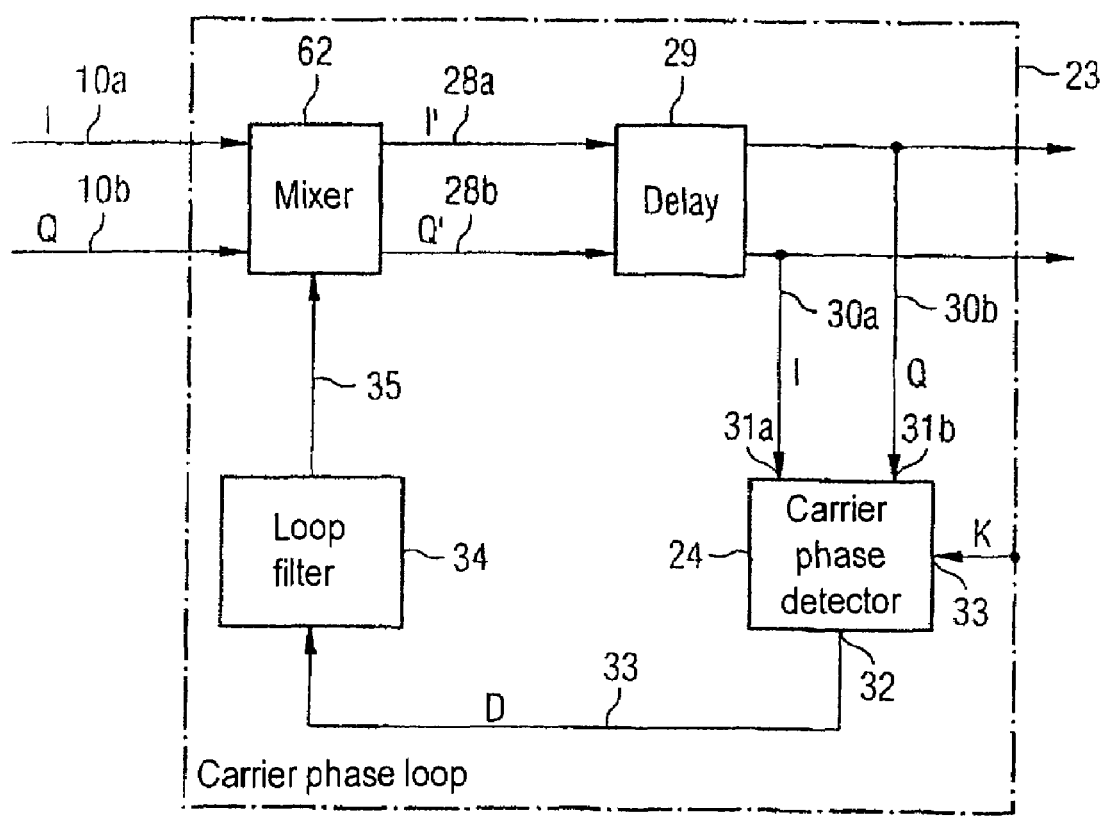
FIG. 10 shows a block diagram of a carrier phase loop with a second embodiment of a carrier phase detector.

FIG. 10 shows a second carrier phase loop 23, which contains a carrier phase detector 24 according to a second embodiment of the invention. The carrier phase loop 23 receives the real part and the imaginary part of a received data symbol via the line 10a, 10b, and mixes this with the filtered output signal from the digital loop filter 34, by means of a mixer 62. The mixed output signal is delayed by a delay circuit 29, and is emitted to two inputs 31a, 31b of the carrier phase detector 24. The second embodiment of the carrier phase detector 24 likewise has a set input 33 for application of a factor K. In the second embodiment of the carrier phase detector 24, no boundary phase φ$_{bound}$ is applied, but a constant K, which allows signal-to-noise adaption. For a 4 PSK-modulated received signal, the function of the second embodiment of the carrier phase detector 24 can be described in accordance with the following equations:

$$\text{IF}\{\text{Abs}(\text{Im}) > (k+1)\text{Abs}[\text{Re}]\} \text{ THEN } D := k \cdot \text{Re Sign}[\text{Im}] \quad (6)$$

ELSE IF = {Abs(Re) > (k + 1)Abs Im}

THEN $D := -k \cdot \text{Im Sign}[\text{Re}]$

Figure 11:
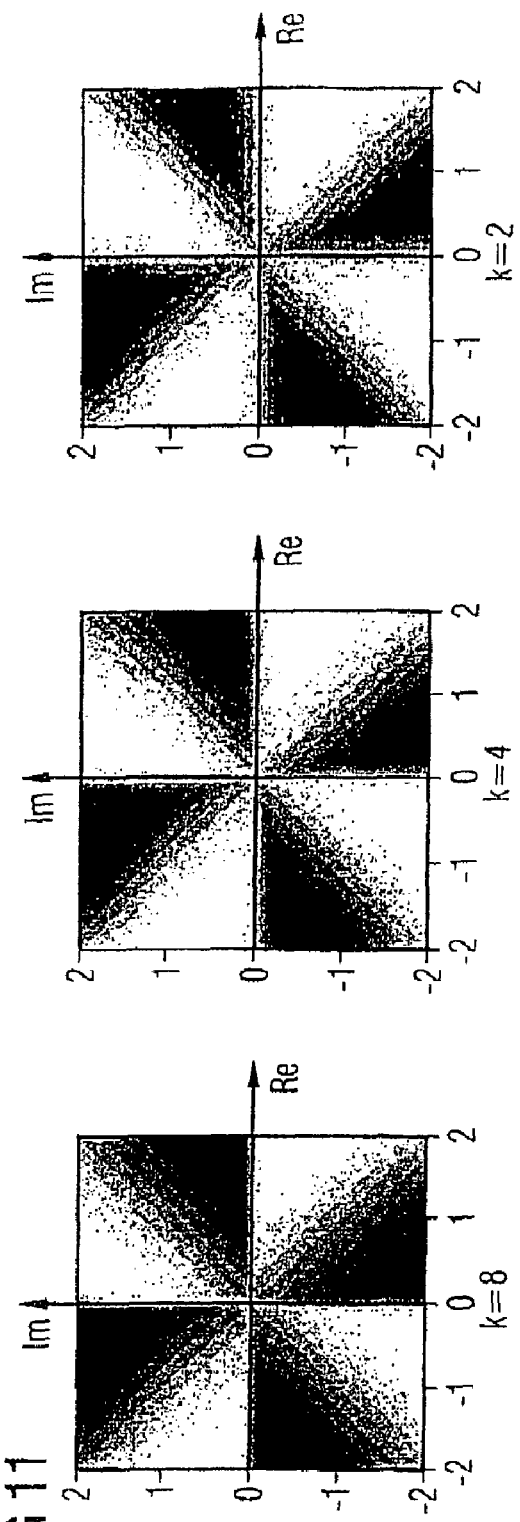
FIG. 11 shows diagrams in order to explain the method of operation of the second embodiment of the carrier phase detector for a 4 PSK received signal.

ELSE $D := \text{Re} \cdot \text{Sign}[-\text{Im}] + \text{Im} \cdot \text{Sign}[\text{Re}]$ FIG. 11 shows the response of the Q PSK carrier phase detector 24 as shown in FIG. 10 for different channel conditions. If the channel 3 is slightly noisy the constant K is set to be high, for example K=8, as can be seen in FIG. 11a. If, in contrast, the channel is highly noisy K is set to be relatively low, for example K=2, as is illustrated in FIG. 11c. The signal-to-noise ratio SNR can be adapted by varying the constant K. In the second embodiment of the carrier phase detector, which is illustrated in FIG. 10, the carrier phase detector 24 receives a real part and the imaginary part of the mixed received signal via the lines 30a, 30b, that is to say the carrier phase detector 24 is provided not only with the angle information but also with information about the amplitude of the received data symbol.

K=2 results in the following feedback signal for four received data symbols:

TABLE 4

|    | E1 | E2   | E3  | E4   |
|----|----|------|-----|------|
| Re | 1  | 1.1  | 0.1 | 1.9  |
| Im | 1  | 0.9  | 1.9 | 0.1  |
| D  | 0  | −0.2 | 0.2 | −0.2 |

The feedback signal D for an 8 PSK carrier phase detector 24 based on the second embodiment is calculated as follows:

$$\text{IF}\left(\text{Abs}(\text{Im}) > \frac{\text{Abs}(\text{Re})}{\text{Tan}\left[\frac{\varphi_g \cdot \pi}{180°}\right]}\right)$$

$$\text{THEN}\left(D := \frac{(22.5° - \varphi_g)}{\varphi_g} \cdot \frac{180°}{\pi} \cdot \text{Re} \cdot \text{sign}[\text{Im}]\right)$$

$$\text{ELSE IF}\left(\text{Abs}(\text{Im}) > \frac{\text{Abs}(\text{Re})}{\text{Tan}\left[\frac{(45° - \varphi_g) \cdot \pi}{180°}\right]}\right)$$

$$\text{THEN}(D := 22.5° \cdot \text{Sign}(\text{Re}) \cdot \text{Sign}(\text{Im}) \cdot \left(-(1 + \sqrt{2})\text{Abs}(\text{Re}) + \text{Abs}(\text{Im})\right))$$

$$\text{ELSE IF}\left(\frac{\text{Abs}(\text{Im})}{\text{Tan}\left[\frac{(45° - \varphi_g) \cdot \pi}{180°}\right]} > \text{Abs}(\text{Re})\right)$$

$$\text{THEN}\left(D := \frac{(22.5° - \varphi_g)}{\varphi_g} \cdot \frac{180°}{\pi \cdot \sqrt{2}} \cdot (-\text{Re} \cdot \text{Sign}(-\text{Im}) - \text{Im} \, \text{sign}(\text{Re}))\right)$$

$$\text{ELSE IF}\left(\frac{\text{Abs}(\text{Im})}{\text{Tan}\left[\frac{\varphi_g \cdot \pi}{180°}\right]} > \text{Abs}(\text{Re})\right)$$

$$\text{THEN}(D := 22.5° \cdot \text{Sign}(\text{Re}) \cdot \text{Sign}(\text{Im}) \cdot \left(-\text{Abs}(\text{Re}) + (1 + \sqrt{2})\text{Abs}(\text{Im})\right))$$

$$\text{ELSE}\left(D := \frac{(22.5 - \varphi_g)}{\varphi_g} \cdot \frac{180°}{\pi} \cdot \text{Im} \cdot \text{Sign}(\text{Re})\right)$$

Figure 12:
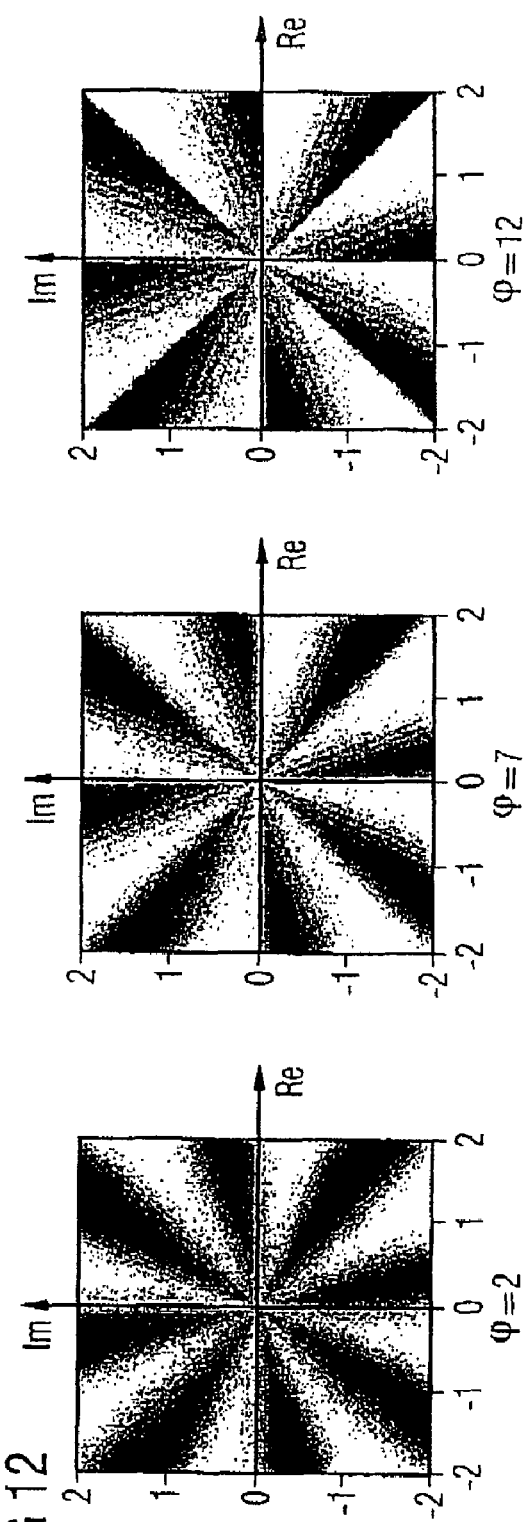
FIG. 12 shows diagrams in order to explain the method of operation of the second embodiment of the carrier phase detector according to the invention for an 8 PSK received signal.

FIG. 12 shows diagrams for an 8 PSK carrier phase detector 24 based on the second embodiment, with $\phi_g$ once again being set for different noise conditions in the channel. The second embodiment of the carrier phase detector 24 thus offers the advantage that, in addition to reducing the variance of the feedback signal D and in addition to the improvement associated with this in the stabilization response of the receiver, matching to the interference noise which is injected into the transmission channel is also additionally possible.

List of Reference Symbols 1 receiver
2 Transmitter
3 Channel
4 Analogue/digital converter
5a, 5b Lines
6a, 6b Resampling filter
7a, 7b Lines
8a, 8b Matched filter
9a, 9b Frequence matched filter
11a, 11b Multiplier
12 Line
13 Loop filter
14 NCO
15 Line
17 Adder
18 Line
19 Loop filter
20 NCO
21 Line
22 Mixer
23 Carrier phase looper
24 Carrier phase detector
25 Phase carrier calculation unit
26 Line
27 Adder
28 Line
29 Delay circuit
30 Line
31 Detector input
32 Detector output
33 Set input
34 Loop filter
35 Line
36 First phase subtractor
37 Memory
38 Line
39 Line
40 Line
41 Phase rotation device
42 Lines
43 Second phase subtractor
44 Memory device
45 Line
46 Line
47 Comparator
48 Line
49 Control line
50 Multiplexer
51 Multiplexer input
52 Multiplexer input
53 Line
54 Weighting circuit
55 Signal input
56 Line
57 Signal input
58 Line
59 Node
60 Multiplexer output
61 Output line
62 Mixer

What is claimed is:

1. Carrier phase detector for calculation of a feedback signal for a carrier phase loop in a receiver, which loop detects a phase error between a phase of a received signal, which comprises a sequence of received data symbols, and a nominal phase of a nominal data symbol, the carrier phase detector comprising:

a detector input that is configured to receive a calculated phase of the data symbols;
a detector output that is configured to be connected to a downstream digital loop filter via a feedback line to emit the feedback signal; and
a control input that is configured to receive a boundary phase; and
wherein the carrier phase detector in each case is configured to calculate the feedback signal as a function of the real part and of the imaginary part of a received data symbol, with a received data symbol whose phase is in a boundary phase area being weighted gradually to a lesser extent during the calculation of the feedback signal, with the boundary phase area in each case being arranged symmetrically with respect to a mid-phase which is located in the centre between the two nominal phases of equidistant nominal data symbols, and having a phase extent which is determined by the boundary phase.

2. Carrier phase detector according to claim 1, wherein a received data symbol whose phase is in a boundary phase area is weighted such that it falls linearly by the carrier phase detector.

3. Carrier phase detector according to claim 1, wherein a received data symbol whose phase is in a boundary phase area is weighted by the carrier phase detector such that it falls in accordance with the square law.

4. Carrier phase detector according to claim 1, wherein the received data symbols are in each case PSK-modulated.

5. Carrier phase detector according to claim 4, wherein the received data symbols are in each case 4 PSK-, 8 PSK- or 16 PSK-modulated.

6. Carrier phase detector according to claim 1, wherein the carrier phase loop further comprises a phase angle calculation unit which calculates the phase of the received data symbol from the real part and from the imaginary part of the received data symbol.

7. Carrier phase detector according to claim 6, wherein the carrier phase detector further comprises a first phase subtractor, which subtracts a constant phase that is adjustable from the calculated phase of the received data symbol in order to produce a first mapped phase.

8. Carrier phase detector according to claim 7, wherein the carrier phase detector further comprises a phase rotation unit, which rotates the mapped first phase into the first quadrant of the complex plane in order to produce a second mapped phase.

9. Carrier phase detector according to claim 8, wherein the carrier phase detector further comprises a second phase subtractor which subtracts half the phase separation 360°/2 m between two equidistant nominal data symbols from the second mapped phase in order to produce a third mapped phase.

10. Carrier phase detector according to claim 9, wherein the carrier phase detector further comprises a comparator which compares the mapped third phase with a variable boundary phase in order to produce a control signal.

11. Carrier phase detector according to claim 10, wherein the carrier phase detector further comprises a weighting circuit, which calculates a weighted feedback signal as a function of the third mapped phase and the variable boundary phase where:

$$D_B = \frac{\left[\text{Sign}(\varphi''') \cdot \left(\frac{360°}{2m} - \varphi'''\right)\right] \cdot \varphi_{bound}}{\left(\frac{360°}{2m}\right) - \varphi_{bound}}$$

where m is the number of equidistant nominal data symbols on the complex plane; and where $\phi'''$ corresponds to the third mapped phase and $\phi_{bound}$ corresponds to the boundary phase with $\phi_{bound} < 360°/(2m)$.

12. Carrier phase detector according to claim 11, wherein the carrier phase detector further comprises a multiplexer which is driven by the control signal produced by the comparator, with the multiplexer passing on a feedback signal, which is proportional to the third mapped phase, to an output of the carrier phase detector when the comparator finds that the third mapped phase is less than the boundary phase, with the multiplexer passing on the feedback signal, which is calculated by the weighting circuit, to the output of the carrier phase detector when the comparator finds that the third mapped phase is greater than the boundary phase.

13. Carrier phase detector according to claim 1, wherein the carrier phase detector is followed by a digital loop filter.

\* \* \* \* \*